United States Patent
Weihnacht et al.

(10) Patent No.: US 10,633,735 B2
(45) Date of Patent: Apr. 28, 2020

(54) METHOD FOR A DEFINED SURFACE TREATMENT OF A FIRST CARBON COATING APPLIED ON A SURFACE OF A COMPONENT

(71) Applicant: FRAUNHOFER-GESELLSCHAFT ZUR FOERDERUNG DER ANGEWANDTEN FORSCHUNG E.V., Munich (DE)

(72) Inventors: Volker Weihnacht, Dresden (DE); Andreas Leson, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 166 days.

(21) Appl. No.: 15/557,278

(22) PCT Filed: Mar. 10, 2016

(86) PCT No.: PCT/EP2016/055147
§ 371 (c)(1),
(2) Date: Sep. 11, 2017

(87) PCT Pub. No.: WO2016/142473
PCT Pub. Date: Sep. 15, 2016

(65) Prior Publication Data
US 2018/0051367 A1   Feb. 22, 2018

(30) Foreign Application Priority Data
Mar. 11, 2015   (DE) .................. 10 2015 204 395

(51) Int. Cl.
*C23C 14/06*   (2006.01)
*C23C 14/58*   (2006.01)

(52) U.S. Cl.
CPC ........ *C23C 14/0605* (2013.01); *C23C 14/588* (2013.01)

(58) Field of Classification Search
CPC ................................................. C23C 14/0605
(Continued)

(56) References Cited

U.S. PATENT DOCUMENTS 5,846,122 A * 12/1998 Graebner ............... B24B 37/04
451/28
2005/0284434 A1   12/2005 Tsuruta et al.
(Continued)

FOREIGN PATENT DOCUMENTS

DE   102011076410 A1   11/2012
DE   102012211864 A1   5/2014
(Continued)

OTHER PUBLICATIONS

Monteiro, Vacuum Arc Deposited DLC Based Coatings, Emerging Applications of Vacuum-Arc-Produced Plasma, Ion and Electron Beams, pp. 197-203, 2002 (Year: 2002).*

*Primary Examiner* — Tabatha L Penny
(74) *Attorney, Agent, or Firm* — Jacobson Holman, PLLC.

(57) ABSTRACT

A method for a defined surface treatment of a first carbon coating applied to a surface of a component The first carbon coating is brought into touching contact with at least one second carbon coating that is formed on a surface of a tool or second component and the two carbon coatings are moved relatively with one another so that the first carbon coating is smoothed by the second carbon coating. The first carbon coating and/or the second carbon coating are formed from a-C (amorphous carbon) or ta-C (tetrahedrally bonded amorphous carbon).

13 Claims, 1 Drawing Sheet

(58) Field of Classification Search
USPC .......................................................... 427/355
See application file for complete search history.

(56) References Cited

U.S. PATENT DOCUMENTS

2007/0204880 A1* 9/2007 Weihnacht .......... C23C 14/0605
  134/6
2013/0199331 A1* 8/2013 Himsel ............... C23C 14/0605
  74/569

FOREIGN PATENT DOCUMENTS

EP    1829986 A1   9/2007
EP    2075091 A1   7/2009

* cited by examiner

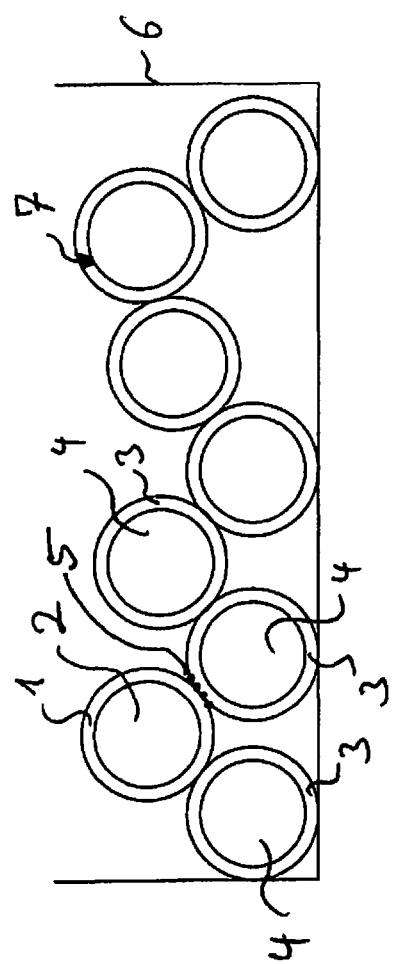

METHOD FOR A DEFINED SURFACE TREATMENT OF A FIRST CARBON COATING APPLIED ON A SURFACE OF A COMPONENT

The present invention relates to a method for a defined surface treatment of a first carbon coating applied to a surface of a component.

An obstacle for a wide introduction of hard carbon layers, in particular ta-C coatings (that is tetrahedrally bonded amorphous carbon) is due to a relatively high layer roughness. This layer roughness is a consequence of growth defects that arise on a deposition of the layers. In particular with ta-C layers that are manufactured using a vacuum arc process, small particles unavoidably arise due to the arc deposition that result in a pronounced layer roughness. In the deposited state, such layers can therefore not be used on sliding components as a rule since they cause high wear on a counter-body. Layers that were deposited using a plasma filter admittedly have a lower roughness due to the filter effect and have an associated reduced defect density, but the roughness is not completely eliminated. Since the roughness increases continuously with the layer thickness, carbon layers deposited using plasma filtering can also only be used up to a specific layer thickness without an additional smoothing.

Since the ta-C layers have an extremely high hardness, conventional techniques for a subsequent layer smoothing are not suitable or only produce a smoothing effect with a high effort.

It is therefore the underlying object of the present invention to develop a method with which a smoothing of surfaces coated with carbon is successful with a much higher efficiency or to provide a correspondingly smoothed component.

This object is achieved in accordance with the invention by a method in accordance with the claims set forth herein.

In a method for a defined surface treatment of a first carbon coating applied to a surface of a component, the first carbon coating is brought into touching contact with at least one second carbon coating that is formed on a surface of a tool. The first carbon coating and the second carbon coating are moved relatively in parallel with one another so that the first carbon coating is smoothed by the second carbon coating. The first carbon coating and/or the second carbon coating is formed from a-C (amorphous carbon) or ta-C (tetrahedrally bonded amorphous carbon).

The method is based on the fact that on a pairing of two surfaces provided with carbon layers, these carbon layers mutually smooth one another in the relative movement until substantially smoother outer surfaces of the carbon layer than before are produced. In this respect, a use of a lapping medium or polishing medium or of an additive of a fluid can be dispensed with. A smoothing of the first carbon coating is thus achieved in an inexpensive manner. A smoothed surface of the first carbon coating is achieved by the method as a process upstream of an installation of the component so that after the installation no wear particles or fewer particles damaging to this use are released in an operation of the component in its respective provided use.

At least two second carbon coatings, particularly preferably a plurality of three or more second carbon coatings that are each located on a component or tool are typically used to smooth the first carbon coating and to themselves be smoothed in interaction with the first carbon coating.

A first carbon coating and a second carbon coating of a hard carbon having a hardness of at least 2000 HV are preferably used to carry out the method since particularly such hard carbon coatings can only be smoothed inexpensively with difficulty using conventional methods.

Provision can be made that a hardness of the first carbon coating is different from a hardness of the second carbon coating and/or differs from a hardness of the second carbon coating by a maximum of ten percent, preferably by a maximum of five percent, particularly preferably by a maximum of two percent. Since the two carbon coatings of the same hardness pair, there is no longer any wear erosion to the detriment of a softer partner or an insufficient smoothing of harder partner.

The first carbon coating and the second carbon coating can be moved relative to one another in an exclusively linear movement extending in one direction. Alternatively, a linearly oscillating, rotating or chaotic relative movement, i.e. any desired sequence of the previously name sliding movements, can be provided to produce a surface contact for a sufficiently long time for smoothing.

A contact pressure between 0.5 N/mm$^2$ and 500 N/mm$^2$, preferably between 1 N/mm$^2$, is used to achieve a sufficiently fast smoothing.

The first carbon coating and/or the second carbon coating is/are typically deposited by a vacuum arc coating process.

Provision can be made that the first carbon coating is smoothed at an environmental temperature between 18° C. and 25° C., that is at room temperature. A high-energy heating of a reception unit for the component and the tool for carrying out the method are thus omitted.

The first carbon coating and the second carbon coating are typically only smoothed by the movement relative to one another and no further aids or substances are required. No processing tool is therefore necessary as long as the carbon coatings to be smoothed are exposed to the movement relative to one another that allows a sufficient smoothing of the requires points and simultaneously does not result in damage to sensitive points, e.g. sharp edges of the component. Alternatively, an iron powder to support the smoothing can also be applied to the first carbon coating and/or to the second carbon coating to utilize a chemically catalytic effect of iron.

Provision can also be made that at least the component is cleaned of particles deposited by the smoothing by a fluid during the smoothing and/or after the smoothing of the first carbon coating. The component is hereby cleansed and can be installed for its intended use. The fluid is typically a liquid, for example a solution, but can also be a gas. The tool is preferably also correspondingly cleaned.

At least one component having the previously described properties can be introduced into a bulk of a plurality of the tools and can be moved with the tools to achieve an efficient smoothing by a plurality of the tools. It is thus possible to carry out a bulk material process. This typically takes place in a reception drum in which the component and the tools with their coatings are contained which are moved therein.

The component and the tool or tools can be formed from the same material to achieve a homogeneous smoothing.

A component in accordance with the invention has a first carbon coating in a smoothed state and at least one defect in the form of a recess. The at least one defect is in this respect generally caused by particles, typically hard carbon particles, that are taken along into the carbon coating during manufacture and that were removed from the coating during smoothing. The at least one defect thus remains as a recess in the carbon coating. The smoothed state should in this respect be achieved after an interaction with a second carbon coating. The first carbon coating can have the previously already described properties.

An $R_a$ roughness of the first carbon coating in the smoothed state should amount to between 0.03 μm and 0.2 μm, preferably to between 0.05 μm and 0.15 μm. An $R_z$ roughness of the first carbon coating can amount to between 0.3 μm and 2 μm, preferably to between 0.5 μm and 1.5 μm. The named roughnesses permit a targeted use of the coated component.

The first carbon coating typically has a thickness between 0.5 μm and 30 μm, preferably between 1 μm and 5 μm, after the smoothing.

Provision can be made that the first carbon coating is formed from a hard carbon having a hardness of at least 2000 H V. The first carbon coating is preferably deposited by a vacuum arc method.

The at least one defect of the first carbon coating typically has a width between 0.5 μm and 10 μm, preferably between 0.1 μm and 3 μm. Provision can also be made that the at least one defect of the first carbon coating has a width, a length or a diameter that is larger than a thickness of the first carbon coating. The at least one defect can equally be present as a hole in the first carbon coating, i.e. as a recess, that reaches down to a surface of the component located beneath the first carbon coating. A plurality of the described defects can also be formed in the first carbon coating.

Provision can be made that the first carbon coating has a carbon proportion of at least 95 percent, preferably of at least 99 percent. No additional components are thus contained in the first carbon coating except for contaminants that cannot be avoided during manufacture or smoothing.

The component with the first carbon coating is typically manufactured using the described method or the first carbon coating is smoothed using the previously described method.

A embodiment of the invention is shown in the drawing and will be explained in the following with reference to FIG. 1.

FIG. 1 shows a cross-sectional view of loose material composed of a component and a plurality of tools that are each provided with a carbon coating.

A component 2, a pin for a use in chain drives in the embodiment shown in FIG. 1, was coated with a 2 μm thick first carbon coating 1 of the type tetrahedrally amorphous carbon (ta-C) as a carbon layer by means of a carbon arc process. This first carbon coating 1 has a hardness of 6000 HV. An outer surface of this first carbon coating 1 has a roughness $R_z$ of 1.5 μm. The first carbon coating 1 is applied to one of the surfaces of the component 2; in further embodiments, the component 2 can, however, also be completely sheathed by the first carbon coating 1.

At least one tool 4 is provided in the same manner with a second carbon coating 3 that has the same properties as the first carbon coating 1. In further embodiments, the hardness of the first carbon coating 1 can, however, also differ by a maximum of up to ten percent from the hardness of the second carbon coating 3. A thickness of the second carbon coating 3 can equally also differ from the thickness of the first carbon coating 1. The tool 4 can be coated as an auxiliary body on smoothing in the same coating process as the component 1 to be processed and can also be used several times in the described method by repeated coating. In further embodiments, a plurality of the components 2 can also be used as the tools 4.

The component 2 is put together with a plurality of tools 4, as shown in FIG. 1, into a drum 6 having catches at a drum wall and the drum subsequently rotates about its horizontal longitudinal axis. The drum 6 can be closed for this purpose so that a closed space results that is bounded by the drum walls. A temperature of 20° C. is present in this closed space and a contact pressure of 0.5 N/mm² is used. A bulk material movement of the volume of the component 2 and the tools 4 formed as bulk material in the drum 6 results due to the rotational movement and thus a relative movement results of the component 2 provided with the first carbon coating 1 and the tools 4 that are provided with the second carbon coating 3. This produces a mutual removal of roughness peaks on the carbon coatings 1, 3. After a sufficiently long time of approximately 15 minutes, the rotational movement is stopped, the drum 6 is opened and the smoothed component 2 and the smoothed tools 4 are removed. The outer surface of the first carbon coating 1 now has a considerably reduced roughness $R_z$ of 0.5 μm. The $R_a$ roughness amounts to 0.05 μm in the embodiment shown. Finally, any dust that has formed can be removed by rinsing with a suitable solution, for example an aqueous medium as a cleaning medium, that can be neutral or alkaline. This rinsing can be carried out both during the surface treatment and as a separate method step after ending the surface treatment. The method described thus works at room temperature without the use of a lapping agent or polishing agent and without the addition of a fluid for smoothing. In further embodiments, a movement taking place linearly in only one direction, an oscillating linear movement or a chaotic movement without a predefined pattern can also take place.

At least some, but also all of the first carbon coatings 1 and/or of the second carbon coatings 2 can have recesses 7 that originate from carbon particles during the manufacture of the respective carbon coating 1, 2 by means of the vacuum arc process. The hard carbon particles are broken out of the respective carbon coating 1, 2 during smoothing and the recess 7 remains as a defect of the respective layer. The recess 7 or, since typically a plurality of defects are present, the recesses 7 of the respective carbon coating 1, 2 have a width of 1 μm on average.

The method can be carried out with the addition of auxiliary substances; however, it is also possible to apply an iron powder 5 into the drum 6 and/or onto an outer surface of the carbon coatings 1, 3 to support the smoothing by a chemically catalytic effect of the iron. Typically, both the first carbon coating 1 and the second carbon coating 2 thus have a carbon proportion of 95 percent to 99 percent. Small proportions of external particles cannot be avoided due to the manufacturing method or due to the smoothing.

Generally, processes such as also used in slide grinding are suitable for the described method, that is e.g. barrel finishing, vibratory grinding and centrifugal machining. It is a requirement that the component 2 as the part to be smoothed is largely coated with carbon over its surface, that is at least by 60 percent, for example, since otherwise damage, i.e. roughening, occurs at uncoated points.

The component 2 provided with the first carbon coating 1 is typically a slide component such as a piston pin, a chain sleeve or a bucket tappet. It can generally be used for automotive applications, i.e. applications in passenger vehicles or commercial vehicles or motorcycles, in their engines, drivetrains, pumps, fuel injectors and auxiliary units, in particular chain drive components, piston pins, valve train components or cogs. In addition, components of stationary pumps, for example pump pistons, shafts or plungers or carbon coated mechanical engineering components such as cogs, guide rails, shafts or machines can also be treated using the described method at treatment and processing machines, e.g. in textile machines and in machines of the paper and printing industries.

The invention claimed is:

1. A method for a defined surface treatment of a first carbon coating applied to a surface of a first component, in which the first carbon coating is brought into touching contact with at least one second carbon coating that is formed on a surface of a second component and the first and second carbon coatings are moved relatively to one another so that the first and second carbon coatings are smoothed by the relative movement of each other, wherein the first carbon coating and/or the second carbon coating is/are formed from a-C (amorphous carbon) or ta-C (tetrahedrally bonded amorphous carbon).

2. A method in accordance with claim 1, characterized in that said first carbon coating and said second carbon coating of a hard carbon having a hardness of at least 2000 HV are used.

3. A method in accordance with claim 1, characterized in that a hardness of the first carbon coating is different from a hardness of the second carbon coating and/or differs from the hardness of the second carbon coating by a maximum of ten percent, or by a maximum of five percent or by a maximum of two percent.

4. A method in accordance with claim 1, characterized in that said first carbon coating and said second carbon coating are moved relative to one another only linearly in one direction, in a linearly oscillating manner, in a rotating manner or in a chaotic movement.

5. A method in accordance with claim 1, characterized in that a contact pressure is used of between 0.5 N/mm$^2$ and 500 N/mm$^2$, or between 1 N/mm$^2$ and 100 N/mm$^2$.

6. A method in accordance with claim 1, characterized in that said first carbon coating and/or said second carbon coating is/are deposited on said first and second components by a vacuum arc deposition method.

7. A method in accordance with claim 1, characterized in that said first carbon coating is smoothed at an environmental temperature between 18° C. and 25° C.

8. A method in accordance with claim 1, characterized in that said first carbon coating (1) and said second carbon coating are only smoothed by the relative movement relative to one another; or in that an iron powder for supporting the smoothing is applied to the first carbon coating and/or to the second carbon coating.

9. A method in accordance with claim 1, characterized in that at least said first component is cleaned of particles deposited during the smoothing by a fluid during and/or after the smoothing.

10. A method in accordance with claim 1, characterized in that said first and second components are introduced into a bulk of a plurality of components and are moved together within the bulk of components.

11. A method in accordance with claim 1 wherein said first and second carbon coatings are moved relatively in parallel to one another.

12. A method for a defined surface treatment of carbon coatings applied to surfaces of a plurality of components, in which a carbon coating applied to at least one component is brought into touching contact with a carbon coating formed on a surface of at least another component, of said plurality of components and the touching carbon coatings are moved relatively to one another so that the carbon coatings are smoothed by each other, wherein the carbon coatings are formed from a-C (amorphous carbon) and ta-C (tetrahedrally bonded amorphous carbon).

13. A method in accordance with claim 12, characterized in that the carbon coatings are only smoothed by the relative movement relative to one another.

* * * * *